(12) United States Patent
Hubbell et al.

(10) Patent No.: US 7,091,127 B2
(45) Date of Patent: Aug. 15, 2006

(54) METHODS AND APPARATUS FOR PATTERNING A SURFACE

(75) Inventors: Jeffrey A. Hubbell, Zurich (CH); Jane P. Bearinger, Livermore, CA (US); Marcus Textor, Schaffhausen (CH)

(73) Assignee: Ecole Polytechnique Federale de Lausanne, Lausanne (CH)

( * ) Notice: Subject to any disclaimer, the term of this patent is extended or adjusted under 35 U.S.C. 154(b) by 471 days.

(21) Appl. No.: 10/246,500

(22) Filed: Sep. 18, 2002

(65) Prior Publication Data

US 2003/0114002 A1 Jun. 19, 2003

Related U.S. Application Data

(60) Provisional application No. 60/323,355, filed on Sep. 18, 2001.

(51) Int. Cl.
*H01L 21/302* (2006.01)
(52) U.S. Cl. .............. 438/704; 438/707; 438/717; 438/725
(58) Field of Classification Search ............ 438/704, 438/707, 717, 725
See application file for complete search history.

(56) References Cited

U.S. PATENT DOCUMENTS

| | | | |
|---|---|---|---|
| 4,764,247 A | 8/1988 | Leveriza et al. | |
| 4,795,660 A | 1/1989 | Cooray et al. | |
| 5,030,352 A | 7/1991 | Varady et al. | |
| 5,688,855 A | 11/1997 | Stoy et al. | |
| 5,733,711 A * | 3/1998 | Juengling | .............. 430/312 |
| 5,821,343 A | 10/1998 | Keogh | |
| 5,871,653 A * | 2/1999 | Ling | ..................... 216/2 |
| 5,925,494 A * | 7/1999 | Horn | ................. 430/270.1 |
| 6,190,834 B1 * | 2/2001 | Narahara et al. | ......... 430/284.1 |
| 6,303,277 B1 * | 10/2001 | Hieda et al. | ................ 430/322 |
| 6,306,165 B1 | 10/2001 | Patnaik et al. | |
| 6,358,557 B1 | 3/2002 | Wang et al. | |
| 6,562,398 B1 | 5/2003 | Braach-Maksvytis et al. | |
| 6,887,332 B1 * | 5/2005 | Kagan et al. | ............... 427/97.3 |

FOREIGN PATENT DOCUMENTS

WO  WO 03/024897  3/2003

OTHER PUBLICATIONS

Bearinger, et al. PPS-PEG Block Copolymers Render Hydrophobic Surfaces Protein and Cell Resistant, European Cells and Materials vol. 2, Suppl. 1, 2001 (p. 45).

(Continued)

*Primary Examiner*—Nadine G. Norton
*Assistant Examiner*—Binh X. Tran
(74) *Attorney, Agent, or Firm*—Clark & Elbing LLP; Kristina Bieker-Brady

(57) ABSTRACT

The present invention provides methods and apparatus for locally patterning surfaces. In one such method, an oxidizable thioether is adsorbed onto a conductive surface. The surface is then contacted with a fluid medium. A conducting stamp is then brought into contact with the fluid medium above the thioether-coated surface. Next, a potential is applied between the stamp and the surface. It is expected that the charge will be transferred through the medium to the coated surface along a shortest distance path, thereby locally oxidizing the thioether and effectively creating a negative patterned image of the conducting stamp on the surface. Remaining adsorbed thioether may then be used as a mask for standard etching or material addition procedures.

21 Claims, 7 Drawing Sheets

OTHER PUBLICATIONS

Libioulle, et al. Contact-Inking Stamps for Microcontact Printing of Alkanethiols on Gold, Langmuir, 1999, 15:300-304.

Nuzzo, et al. Fundamental Studies of the Chemisorption of Organosulfur Compounds on Au(111). Implications for Molecular Self-Assembly on Gold Surfaces, Journal of the American Chemical Society, 1987, 109:733-740.

Nuzzo, et al. Adsorption of Bifunctional Organic Disulfides on Gold Surfaces, Journal of the American Chemical Society, 1983, 105:4481-4483.

Tam-Chang, et al. Self-Assembled Monolayers on Gold Generated from Alkanethiols with the Structure $RNHCOCH_2SH$, Langmuir, 1995, 11:4371-4382.

* cited by examiner

— Au in 0.1 M TBAP (MeOH)
— Au + PPSPEG in 0.1 M TBAP (MeOH)

— Au in 1.0 M NaClO$_4$ (Aq)
— Au + PPSPEG in 1.0 M NaClO$_4$ (Aq)

METHODS AND APPARATUS FOR PATTERNING A SURFACE

CROSS-REFERENCE TO RELATED APPLICATIONS

This application claims benefit of priority to U.S. Provisional Application No. 60/323,355, filed Sep. 18, 2001, hereby incorporated by reference.

BACKGROUND OF THE INVENTION

The present invention relates to the field of surface patterning.

Electron beam ("e-beam") lithography has successfully been employed in a variety of industrial applications to fabricate very small structures. Though often effective, e-beam lithography is slow and expensive for many applications. Techniques therefore have been developed to lower costs and decrease production times. Specifically, e-beam lithography has been used to create a master, from which a stamp may be created. A stamping material (ink) is then applied to the stamp, which is subsequently brought into contact with a surface. The stamping material is transferred to the surface at locations where the stamp contacts the surface. The surface may then be etched to remove surface material at all points that are not coated with stamping material, thereby replicating the stamp.

Stamping of alkane thiols onto a gold surface has been extensively investigated. The alkane thiol is either absorbed into or adsorbed onto the stamp, which is then brought into contact with a gold surface. When chemisorbed to a surface, alkane thiols commonly produce a layer of close-packed, independent chains, which is often used to modify the surface, for example, to alter corrosion resistance and/or electrical properties, or to pattern the surface. Common alkane thiols include octadecanethiol and hexadecanethiol. Alkane thiols are typically applied from solution, e.g., in ethanol or hexane, to surfaces such as gold, silver, or copper.

Although stamping of alkane thiols on gold surfaces has been extensively investigated, to date the method has only proven itself in the laboratory and has not been effectively transferred to industrial settings, because of the complexities of the stamping process. The simultaneous and often contradictory requirements of rapid diffusion and high solubility of the alkane thiol onto the stamp, appropriate mechanical characteristics of the stamp, fast reaction rates relative to surface diffusion rates of the alkane thiol onto the gold substrate, high irreversibility on the gold surface, and resistance of the stamping material to subsequent processing steps have been difficult to achieve. Thus, a central factor limiting adaptation of the laboratory technique to industrial applications is the difficulties encountered while trying to achieve simultaneous control of multiple time-dependent, or rate-dependent, processes.

In view of the drawbacks associated with prior art techniques, it would be desirable to provide methods and apparatus for patterning surfaces that overcome these drawbacks. It also would be desirable to provide methods and apparatus for patterning surfaces that require control of fewer rate-dependent processes. Desirably, these methods and apparatus can be used in industrial applications.

SUMMARY OF THE INVENTION

In one aspect, the invention feature a kit for patterning a surface that includes an electrically conducting stamp, a surface, a thioether adsorbed onto the surface, and a fluid medium, wherein the surface and the conducting stamp are in communication with the fluid medium (e.g., electrically coupled to the medium). The kit may further include an energy source capable of applying energy (e.g., electrical potential or radiation) locally between said stamp and said surface. Exemplary media include gases (e.g., air), liquids (e.g., aqueous solutions or organic solvents), and gels. These media may be conductive, e.g., by containing oxygen, oxidizing ions, Redox species, Redox mediators, or electron transfer agents.

The invention further features a patterned surface that includes a coating of a thioether that is locally oxidized in a region on the surface. The surface coating may contain a negative image of an electrically conducting stamp along which the locally oxidized portion of the thioether is capable of being removed from the surface. The surface coating may also be adapted for use in an etching or deposition process.

In another aspect, the invention features a method of patterning a surface including the steps of providing a surface including an adsorbed thioether; locally applying energy (e.g., electrical potential or radiation) to the thioether to produce a locally oxidized region of the thioether; and removing the locally oxidized region of the thioether (e.g., by rinsing) to produce a patterned mask, thereby patterning the surface. In one embodiment, the method of further includes the step of performing an etching or deposition procedure on the surface through the patterned mask to produce a pattern in or on the surface of said locally oxidized region of the thioether. This embodiment may further include removing the mask from the surface after the etching or deposition step. A patterned, conductive stamp or a scanning probed may be used to apply energy locally to said thioether. The energy may be applied in any of the media described above.

The invention also features a patterned surface having a surface coating of a thioether that is locally oxidized in a region and that is produced using the kit described above, and the invention features a patterned mask produced by the kit or the methods described herein. In another aspect, the invention features an altered surface that is etched or has material deposited onto it through a mask of the invention and that is produced by the methods described herein.

Desirably, the thioether used in the above aspects is a block copolymer, e.g., one having a structure of AB, ABA, AB-s-s-BA, or ABA'. The thioether is adsorbed to a surface by chemisorption or physisorption. In another embodiment, the thioether includes a block, e.g., B (such as poly(propylene sulfide)), capable of being oxidized. The thioether may also include a hydrophobic or amphiphilic block, e.g., A. The hydrophobic or amphiphilic block may include poly (ethylene glycol), poly(propylene oxide), or poly(1,2-butylene oxide). The hydrophobic or amphiphilic block has, for example, a glass transition temperature lower or higher than a process temperature used for etching or deposition. A block copolymer of the invention may also include a block, e.g., A, that is conductive. Such a conductive block may include an oxidant, such as an oxidizing ion, a Redox species, a Redox mediator, a diffusible electron transfer agent, a tethered electron transfer agent, or a tethered electron transfer agent incorporated into the polymer chain of the block. Typically, a thioether block is adsorbed to the surface, and a hydrophobic or amphiphilic block extends from the surface as an overlayer. Desirably, the thioether's pendant chain(s) are conductive, e.g., contains oxidizing ions, Redox species, Redox mediators, or diffusible or tethered electron transfer agents.

In various embodiments, a conductive stamp contains a conductive region including the entire stamp, a 2-dimensionally patterned section of the stamp, a 3-dimensionally patterned section of the stamp, any arbitrary localized region, or a scanning probe. A conductive stamp is fabricated, for example, using e-beam lithography.

The thioethers of the invention are typically adsorbed on a surface including a material such as a metal (e.g., gold, silver, or copper), a hydrophobic material, an electrically conducting material, a semiconducting material, silicon, or a combination thereof. In one embodiment, the coated surface is immersed in a fluid medium, for example, an aqueous or organic medium.

In various embodiments of any of the above aspects, the methods or kits are used to fabricate devices such as electronic circuits, microelectromechanical devices, or microfluidic devices.

In other embodiments, the thioether in the thioether-coated surface reduces the adsorption of protein or the adhesion of cells to the surface by at least 20, 30, 40, 50, 60, 70, 80, 90, or 95% relative to a control surface without the surface coating (see, for example U.S. Provisional Application No. 60/323,353, filed Sep. 18, 2001 and U.S. application Ser. No. 10/246,362, filed Sep. 18, 2002, entitled "Methods and Apparatus for Coating Surfaces to Reduce Protein Adsorption and Cell Adhesions and Present Ligands").

By "electrically coupled" is meant capable of passing electrical current.

By "electron transfer agent" is meant a species that is capable of accepting an electron from one species and transferring it to another species. By a "tethered electron transfer agent" is meant an electron transfer agent that is chemically or physically bound to a surface, e.g., through an adsorbed thioether. By a "diffusible electron transfer agent" is meant an electron transfer agent that is free to diffuse through a fluid medium, including through an adsorbed thioether layer.

By "in communication with" is meant in physical contact with or electrically coupled to.

By "locally applying" is meant applying in a discrete region. When locally applying energy, the energy may be applied to one continuous area or to two or more discrete areas. The resolution of the application is determined by the process parameters. Locally applying energy to a thioether of the invention produces a locally oxidized region of the thioether.

By "oxidizing ion" is meant an ion that is capable of oxidizing another species.

By a "process temperature" is meant the operating temperature for a given process, e.g., etching.

By "Redox mediator" is meant a species that transfers electrons from the conducting stamp to the surface.

By "Redox species" is meant a species capable of undergoing oxidation or reduction.

By "scanning probe" is meant a probe that is capable of being translated across a surface in a desired pattern. Exemplary scanning probes include those employed in atomic force microscopy and scanning tunneling microscopy.

By "thioether" is meant a compound having a sulfur atom bound to two carbon atoms. Exemplary thioethers of the invention are oligomeric or polymeric thioethers, such as block copolymers.

The methods of the present invention have several advantages over the prior art techniques for stamping alkane thiols on gold. First, no mass is actually transferred from the conducting stamp to surface, i.e., one does not need to absorb ink into the stamp or transfer ink from a pad to the stamp surface. Second, there is no need to optimize a rate of ink-substrate reaction relative to diffusion and flow of ink on the substrate, since the entire substrate is first coated with the thioether. Third, since the thioether is multivalently bound to the substrate, its rate of surface diffusion after pattern transfer is exceedingly slow. Finally, the properties of the stamp may be optimized independently of considerations about interactions with the thioether—it need merely support wetting of the thioether (e.g., the A block of a thioether copolymer may be designed to wet the stamp surface) if direct contact between the stamp and the thioether adsorbate is desired. The same considerations are true for scanning probes.

Further features and advantages of the invention will be apparent from the following description and the claims.

Figure 1A:
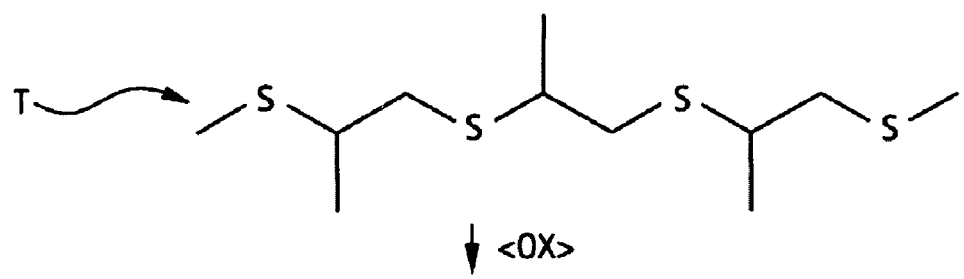
FIGS. 1A–1C are schematic representations of chemical reactions demonstrating oxidation of a copolymer containing poly(propylene sulfide).

The figures are not drawn to scale.

DETAILED DESCRIPTION OF THE INVENTION

The present invention features patterned surfaces and methods and devices for patterning such surfaces. The invention focuses of the use of a thioether as a surface coating. Selective oxidation of the thioether provides a means to pattern the coating.

The thioethers of the invention are typically hydrophobic or amphiphilic. Exemplary hydrophobic thioethers include block copolymers of poly(propylene sulfide) and poly(propylene oxide) ("PPS-PPO") and of poly(propylene sulfide) and poly(1,2-butylene oxide) ("PPS-PBO"), and exemplary amphiphilic thioethers include block copolymers of poly (propylene sulfide) and poly(ethylene glycol) ("PPS-PEG"). PPS and PPS-PEG are described in U.S. application Ser. No. 10/047,404, filed Oct. 19, 2001, U.S. Provisional Application No. 60/323,353, filed Sep. 18, 2001, and U.S. application Ser. No. 10/246,362, filed Sep. 18, 2002, entitled "Methods and Apparatus for Coating Surfaces to Reduce Protein Adsorption and Cell Adhesions and Present Ligands." Additional thioethers are known to those skilled in the art. Individual blocks in a copolymer may contain, for example, on average 5–100 monomer units, 5–50 monomer units, 5–25 monomer units, 5–10 monomer units, 10–50 monomer units, or 10–25 monomer units. The block sizes are selected, for example after experiment or theory, such that the adsorbing block is sufficiently large to impart the desired stability of adsorption, and any pendant blocks are sufficiently large as to impart the desired function of the pendant block, such as incorporation of an electron transfer agent or protection of the surface from an etchant in solution. The ratio of sizes is also a consideration, for example when a large pendant block is required for function of that layer, it may be desirable to have a correspondingly large adsorbing block. In addition, blocks that make up a polymeric thioether of the invention may include a mixture of monomers.

With reference to FIG. 1, AB, ABA, and AB-s-s-BA copolymers, containing a polysulfide, for example poly (propylene sulfide) ("PPS"), as the B block, may be synthesized by known methods. A blocks represent pendant chains, while s represents a sulfur atom. PPS is very hydrophobic, is non-crystalline, and chemisorbs to gold, silver, or copper substrates in a manner similar to thiols. Other polysulfides can also be hydrophobic, demonstrate crystalline or amorphous character, and chemisorb to gold, silver, or copper substrates in a manner similar to thiols.

As will be apparent to those of skill in the art, a wide range of A blocks, having varying physical and/or chemical properties, may be provided. The A blocks may be of varying length or spacing. The blocks may be amphiphilic, e.g., poly(ethylene glycol) blocks. Alternatively, the blocks may be hydrophobic, especially when aqueous liquid-based etching techniques are used to pattern, as described herein. In certain embodiments, the glass transition temperature, $T_{g,A}$, of the A block desirably is lower than a process temperature, T. In this case, a monolayer coating of the copolymer may be chemisorbed or physisorbed onto a conducting hydrophobic surface or a gold, silver, or copper surface, and the thioether, e.g., PPS, backbone chain would coat the surface with a supported overlayer of A block extending therefrom (see FIG. 2). Although the supported A overlayer would be a disordered monolayer, it is expected that the overlayer would be pin-hole free, as $T > T_{g,A}$. Obviously, the structure of the overlayer would be dependent on the characteristics of the air-liquid or air-A interface. Desired A blocks include poly(propylene oxide) and poly(1,2-butylene oxide). Additional A blocks will be apparent to those of skill in the art.

In particular, there are advantages in some instances to using A blocks that are amorphous but demonstrate $T_{g,A}$ above a process operating temperature. This property would permit processes to be carried out at an operating temperature greater than $T_{g,A}$, e.g., an annealing operation to remove pin-holes in the supported A overlayer and then cooling to an operating temperature lower than $T_{g,A}$, i.e., to a glassy state, to reduce permeability of etchants through the remaining, nonoxidized adsorbate. In most cases, permeation of etchants through the supported A overlayer will be lower if the operating temperature is lower than $T_{g,A}$. Such polymers could include polyacrlate copolymers with copolymer composition designed to have $T_{g,A}$ about 10–20° C. above a process temperature.

Alternatively, to reduce the permeability of etchants in the supported A overlayer, A blocks may be employed that form a crystalline supported A overlayer. In most cases, permeation of etchants through a crystalline supported A overlayer will be less than that through a corresponding amorphous supported A overlayer below its $T_{g,A}$, which will be less than that through a corresponding amorphous supported A overlayer above its $T_{g,A}$. In the cases of crystalline supported A overlayers, care must be taken in design of the A block and selection of the processing conditions to avoid the formation of pin-holes during the various processing steps.

Figure 1B:
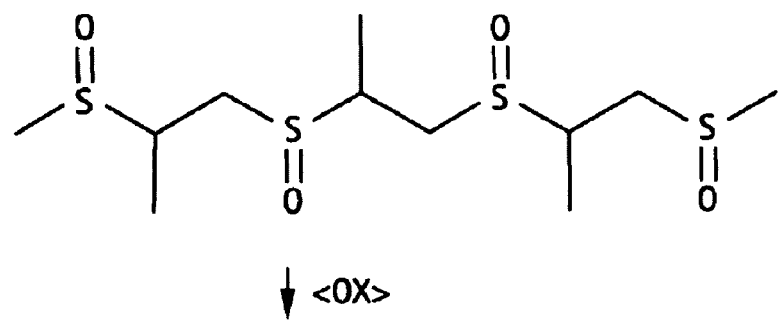
Figure 1C:
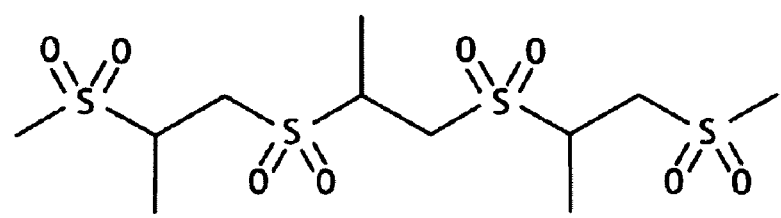

Referring again to FIGS. 1A–1C, it has been shown that PPS can be oxidized to a form that is much more hydrophilic and does not chemisorb to metal surfaces, such as gold, silver, or copper. FIGS. 1A–1C illustrate the chemical reactions involved in the oxidation of PPS thioether T, where each S represents a sulfur atom. Upon exposure to oxidizing species <OX> under conditions that accelerate oxidation, such as at an appropriate redox potential, an oxygen atom O bonds to each sulfur atom S, as seen in FIG. 1B. In FIG. 1C, continued exposure to the oxidizing species under conditions that accelerate oxidation causes an additional oxygen atom O to bind to each sulfur S, thereby further increasing hydrophilicity and altering the chemistry of the original thioether T such that it does not adsorb as well to conducting metal surfaces such as gold, silver and copper.

The use of block copolymeric thioethers provides a great deal of design flexibility with regard to both the oxidation and desorption steps. If, for example, the polymeric adsorbate is designed as an ABA block copolymer, with the thioether in the B block, the B block may be either a crystalline or an amorphous material. In desirable embodiments, the B block does not contain side groups that resist the adsorption of the B block. The A blocks may also be crystalline or amorphous. Desirably, the A blocks are capable of electron transfer via tunneling; they swell sufficiently in the oxidation fluid to permit electron transfer to the B block adsorbed on the surface; or they contain tethered electron transfer sites to permit conduction through the A block overlayer upon the substrate. For subsequent desorption, it is desirable for the $AB_{ox}A$ copolymer ($B_{ox}$ indicating the copolymer after oxidation) to be soluble in solvents commonly used in microelectronic processing operations, including water. For subsequent etching, it is desirable for the B block to form an overlayer that is impermeable to solvents commonly used in microelectronic processing operations, including water. To obtain this impermeability and a defect-free overlayer, the B layer may be hydrophobic, to permit etching of a metal surface in aqueous solvents, and amorphous. For example, if B is hydrophobic, amorphous, and has a glass transition temperature that is lower than the process temperature, the adsorbed ABA block copolymer serves to immobilize an impermeable overlayer of liquid B to resist permeation of etching agents used in aqueous microelectronic processing operations. Etching in nonaqueous media is also known in the art.

Figure 2:
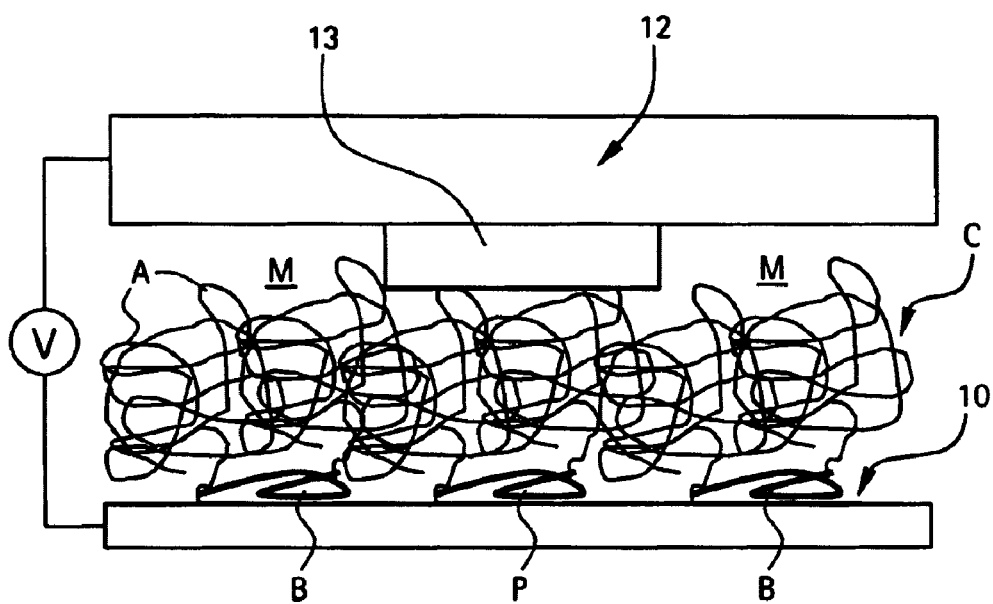
FIG. 2 is a schematic view of an apparatus for patterning surfaces in accordance with the present invention.

With reference now to FIG. 2, an apparatus in accordance with the present invention for patterning a surface is provided. In FIG. 2, surface 10 includes adsorbed copolymer C. Surface 10 is desirably conductive and either hydrophobic or a metal, such as silicon or gold, silver, or copper. Copolymer C is, for example, an AB, an ABA, or an AB-s-s-BA copolymer, as described previously. Additional structures will be apparent to those of skill in the art, for example, ABA', where A' is of the same composition as A, but of different molecular weight. PPS blocks B of copolymer C are adsorbed to the surface, while pendant chain blocks A are supported as an overlayer. Surface 10 and copolymer C are disposed in fluid medium M.

Conducting stamp 12 is disposed within close proximity, for example, in contact, with medium M and/or pendant chain blocks A. Conducting stamp 12 may be formed, for example, using traditional e-beam lithography techniques. Stamp 12 may have any of a variety of conductive patterns, for example, stamp 12 may be entirely conducting, may be conductive along 2- or 3-dimensionally patterned sections, or may conduct along any arbitrary localized region 13.

In one example, medium M is a liquid medium, for example, an aqueous or organic solution. In another example, the medium is a gaseous medium, for example, air. In a third example, the medium is a gel, for example an aqueous or organic solution containing a poorly soluble polymer. Either medium M or pendant chain blocks A are conductive, e.g., they contain oxidizing ions (such as $KMnO_4$, $OsO_4$, $NH_4ClO_4$), Redox species (such as $H_2C_2O_4$, Mg, Sn, $Cl^-$, $I^-$), or diffusible or tethered electron transfer agents. Tethered electron transfer agents may, for example, be incorporated covalently along the A block polymer chain to enhance charge transfer. Exemplary electron transfer agents include quinines, cytochromes, iron-sulfur clusters, and polypyrrole. In some cases, it will be possible to graft or complex oxidizing ions, redox species and electron transfer agents to the terminus or backbone of the A block.

Figure 3:
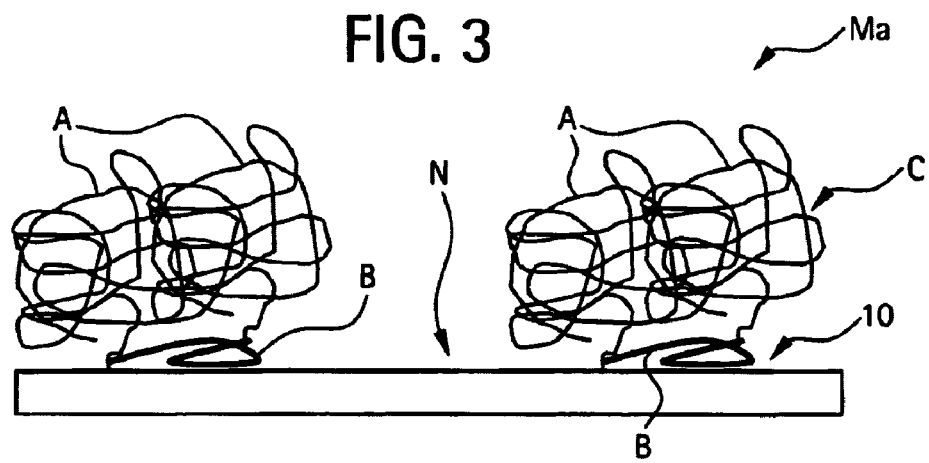
FIG. 3 is a schematic view of the surface of FIG. 2, locally patterned with the negative image of a portion of a conductive stamp.

Referring to FIGS. 2 and 3, in conjunction with FIGS. 1A–1C, a method for electrochemically patterning surface 10 is described. In FIG. 2, voltage or applied potential V is applied between localized region 13 of conducting stamp 12, and surface 10. Since it is expected that copolymer C forms a pin-hole free overlayer, when medium M is a fluid medium, it is expected that voltage V will be transferred to copolymer C and surface 10 along the shortest distance path between the stamp and the surface. As described with respect to FIGS. 1A–1C, PPS blocks B are subject to oxidation. Thus, it is expected that voltage V, locally applied between localized region 13 and surface 10, will locally oxidize PPS blocks B disposed along the shortest distance path between the localized region and the surface, effectively creating oxidation pattern P that mimics the shape of localized region 13 in the PPS blocks B of adsorbed copolymer C. Dielectric characteristics of pendant chain blocks A will influence this process.

In one example, a conducting stamp, formed, for example, using traditional e-beam lithography techniques, is first brought into contact with the fluid medium near the coated surface surface. Next, an electrical charge is applied to the conducting stamp. It is expected that the charge will be transferred through the medium to the coated surface along a shortest distance path, thereby locally oxidizing the thioether and effectively creating a negative patterned image of the conductive region of the conducting stamp on the surface. The oxidative sensitivity of the thioethers has been described, for example, in U.S. application Ser. No. 10/047,404, filed Oct. 19, 2001.

In an alternative embodiment, the stamp may be a scanning probe, which is itself the source of the oxidizing potential. In certain embodiments, the use of a scanning probe is advantageous, in that it creates a highly localized and controllable potential field, and the distance between the probe tip and the polymer adsorbate may be modulated. The scanning probe may be scanned across the surface in the desired pattern and at a desired rate, and the current/potential relationship may be utilized in determining the optimal distance between the probe tip and the polymer adsorbate. In other embodiments, an array of scanning probe tips may be utilized. Such scanning probes and arrays of scanning probes are known in the art.

Oxidation pattern P renders the copolymer C both less reactive to surface 10 and more hydrophilic. Thus, copolymer C may spontaneously separate from surface 10 into medium M along oxidation pattern P. Alternatively, oxidation pattern P may be removed through an optional rinse in an appropriate solvent (not shown). The solvent desirably is compatible with surface 10 and/or the oxidized portion of copolymer C, but is a poor solvent for the reduced portion of the copolymer that has not been exposed to voltage V. As seen in FIG. 3, regardless of whether or not an optional rinse is required, negative image N of localized region 13 of stamp 12 is formed along oxidation pattern P and remains on surface 10 after removal of the oxidized portion of copolymer C.

Oxidation pattern P and negative image N of localized region 13 alternatively may be formed on surface 10 using a gaseous fluid medium M, such as air. Without wishing to be bound by any mechanism, it is believed that in air localized oxidation may be achieved by bringing localized region 13 of conducting stamp 12 within tunneling distance of the surface. When potential is applied, oxidizing species are extracted from the air, facilitating formation of pattern P.

Referring to both patterned oxidation in liquid and gaseous environments, the stamp may be replaced with, or may comprise, a scanning probe, which is itself the source of the oxidizing potential. The use of a scanning probe may be advantageous, in that it creates a highly localized and controllable potential field, and the distance between the probe tip and the polymer adsorbate may be modulated. The scanning probe may be scanned across the surface in the desired pattern and at a desired rate, and the current/potential relationship may also be utilized in determining the optimal distance between the probe tip and the polymer adsorbate. Moreover, an array of scanning probe tips may be utilized. Such scanning probes and arrays of scanning probes are known in the art.

Once negative N has been formed on surface 10, the remaining copolymer C may be used as an ultra-high resolution, ultra-thin mask Ma. Mask resolutions and/or thicknesses desirably are less than about 100 nm, and even more desirably less than about 10 nm. Resolution of the pattern may be controlled, for example, by controlling the dielectric properties of the A block, or by controlling the distance between the stamp and the surface. Mask Ma may be used, for example, in etching processes to remove material from surface 10 within exposed regions of negative N (not shown). Water-based liquid-phase etches are known. Thus, using hydrophobic A blocks, it is expected that regions of surface 10 to which copolymer C is still attached, i.e., mask Ma, may be excluded from the etching processes. After etching, mask Ma optionally may be removed from surface 10 using, for example, appropriate solvents (not shown), thereby providing a locally patterned surface 10. Alternatively, a surface layer may be deposited on surface 10 in the exposed regions of negative N. For example, a metal or polymer may be deposited on the surface 10, and the mask Ma is then removed leaving a positive relief of material on the surface. This process is similar to lift off in photolithography. Metals may be deposited on a surface by electroplating or electroless deposition. The surface patterning may also be used to deposit a different thioether (or thiol) than that used to initially coat the surface. The patterned surfaces of the invention may also be used to control the selective deposition of proteins, other biological macromolecules, and cells, for example in high throughput screening applications, combinatorial chemistry applications, and applications of the detection of surface binding biomolecules such as DNA, RNA, proteins and peptides.

The methods and apparatus of the present invention will now be demonstrated through a non-limiting example.

EXAMPLE

Figure 4A:
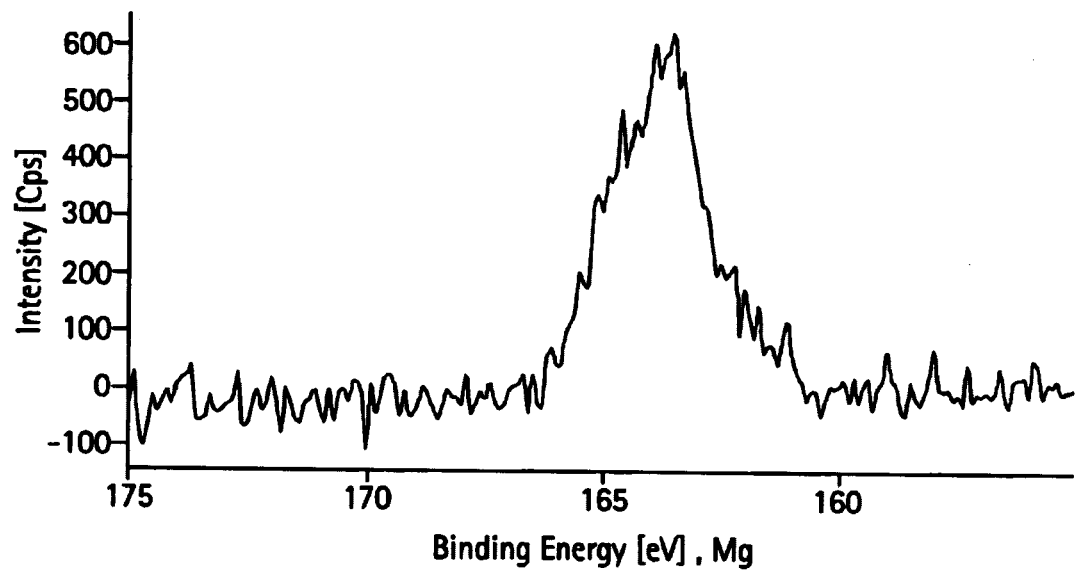
FIGS. 4A and 4B are graphs of X-ray Photoelectron Spectroscopy ("XPS") data, demonstrating a bulk shift of the thioether polymer from a reduced to an oxidized state upon application of electrical potential.
Figure 4B:
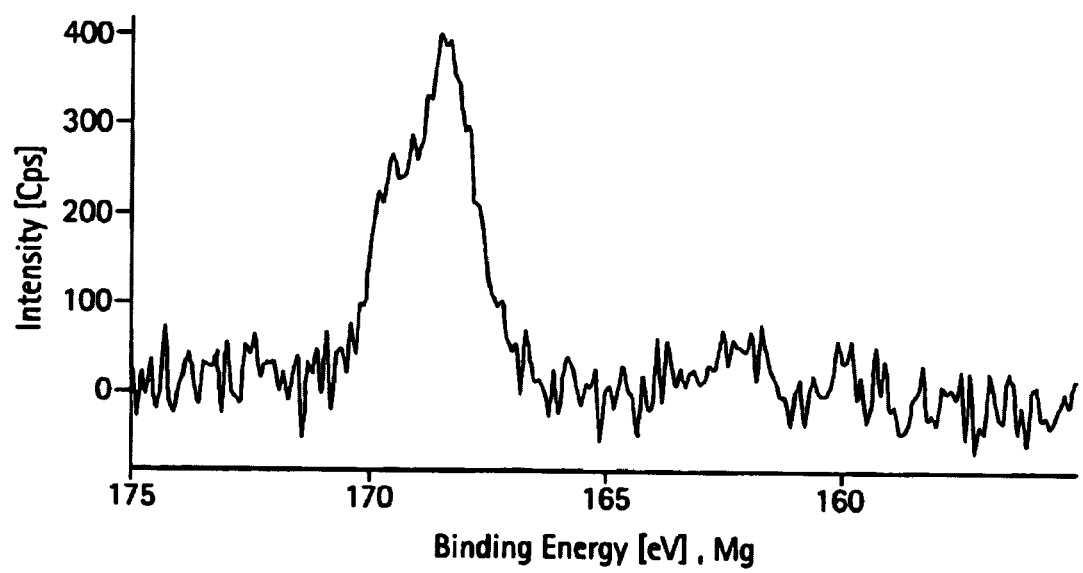

With reference now to FIGS. 4A and 4B, PPS-PEG copolymer ($PEG_{17}PPS_{25}PEG_9$, where the subscripts denote the number of monomers in each block) was adsorbed onto an experimental gold surface. Potential was applied to the bulk surface from a conductive stamp in air to oxidize the PPS backbone, using the method described above with respect to FIGS. 1–3. The data of FIG. 4A was collected prior to potential application, while the data of FIG. 4B was collected after potential application. FIGS. 4A and 4B demonstrate a shift of the thioether polymer from a reduced to an oxidized state upon potential application.

Figure 5:
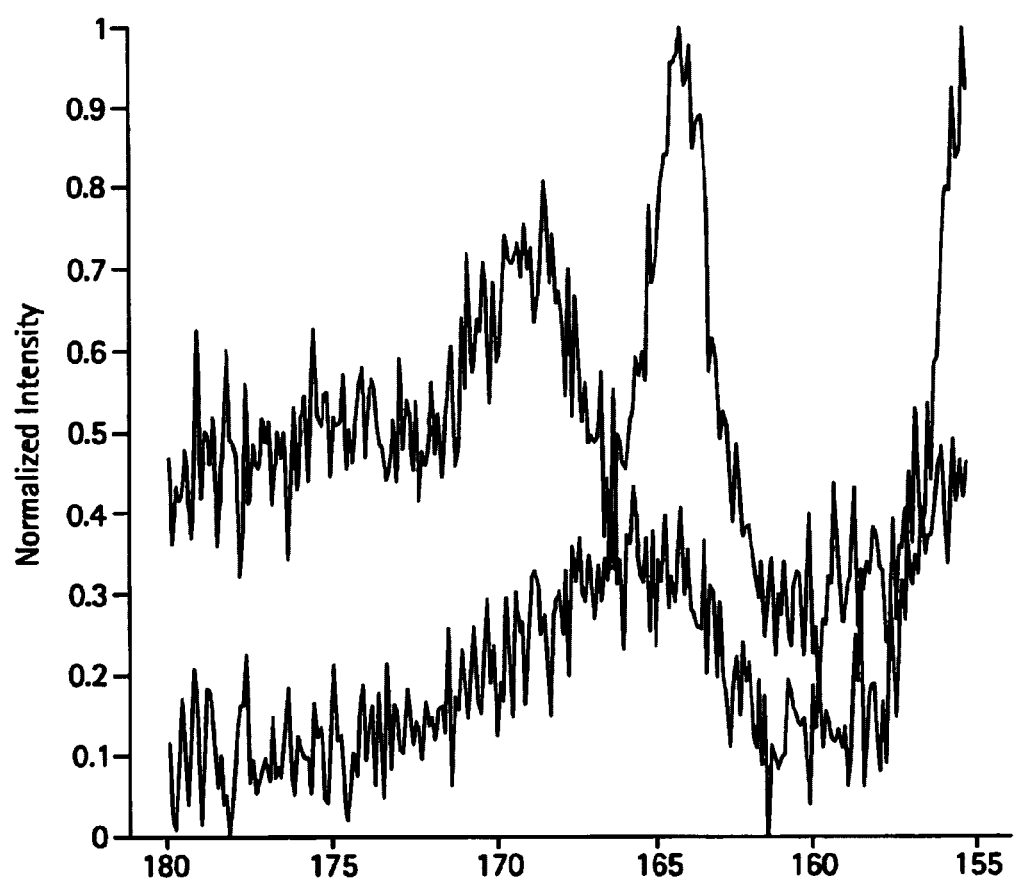
FIG. 5 is a graph of XPS data demonstrating a localized shift of the thioether polymer within a locally affected target site.

Referring to FIG. 5, the experiment of FIG. 4 was repeated, but potential was applied to a localized target site, as opposed to the bulk surface. FIG. 5 presents the curves from both before and after localized potential application and demonstrates a localized shift of the thioether polymer within the locally affected target site.

Figure 6A:
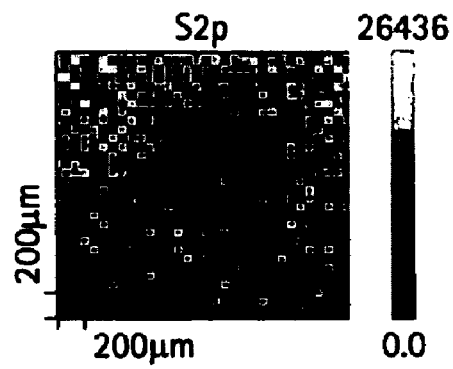
FIGS. 6A–6C are scanning XPS images of the locally affected target site of FIG. 5, depicting total sulfur content, sulfide content, and oxidized sulfur content, respectively.
Figure 6B:
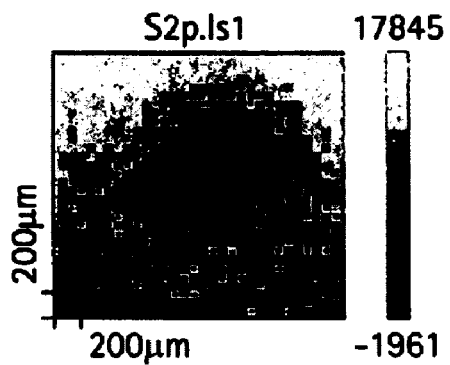
Figure 6C:
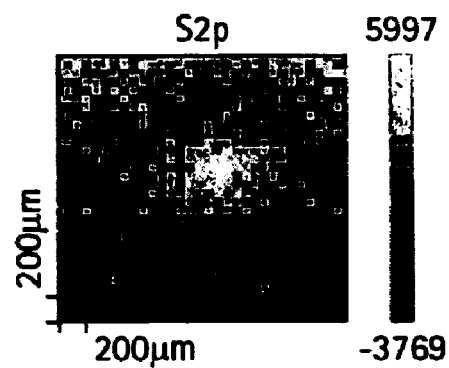

FIGS. 6A–6C are scanning XPS images of the locally affected target site of FIG. 5. FIGS. 6A–6C depict total sulfur content, sulfide content, and oxidized sulfur content, respectively. Sulfur content is visibly different within the local site, providing further verification that the surface has been locally affected.

Figure 7:
FIG. 7 is a low-voltage Scanning Electron Micrograph ("SEM") of the locally affected target site of FIG. 5.

In FIG. 7, a low-voltage Scanning Electron Micrograph ("SEM") of the locally affected target site of FIG. 5 visually demonstrates physical alteration of the target site due to potential application.

Figure 8A:
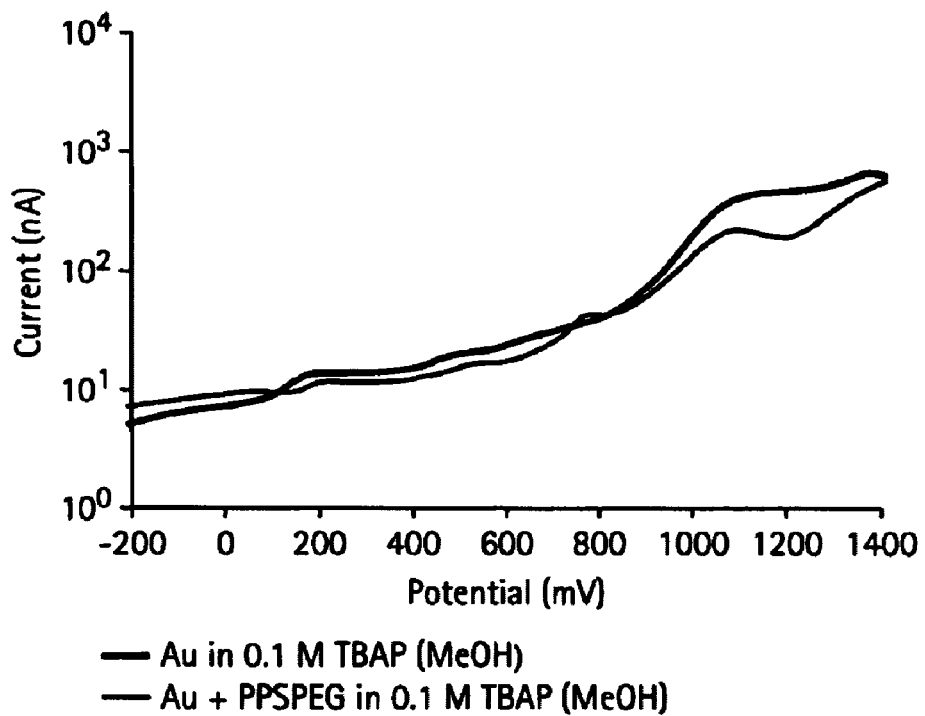
FIGS. 8A and 8B are graphs of polarization curves for bare and thioether-coated surfaces immersed, respectively, in organic and aqueous solutions containing oxidizing species.
Figure 8B:
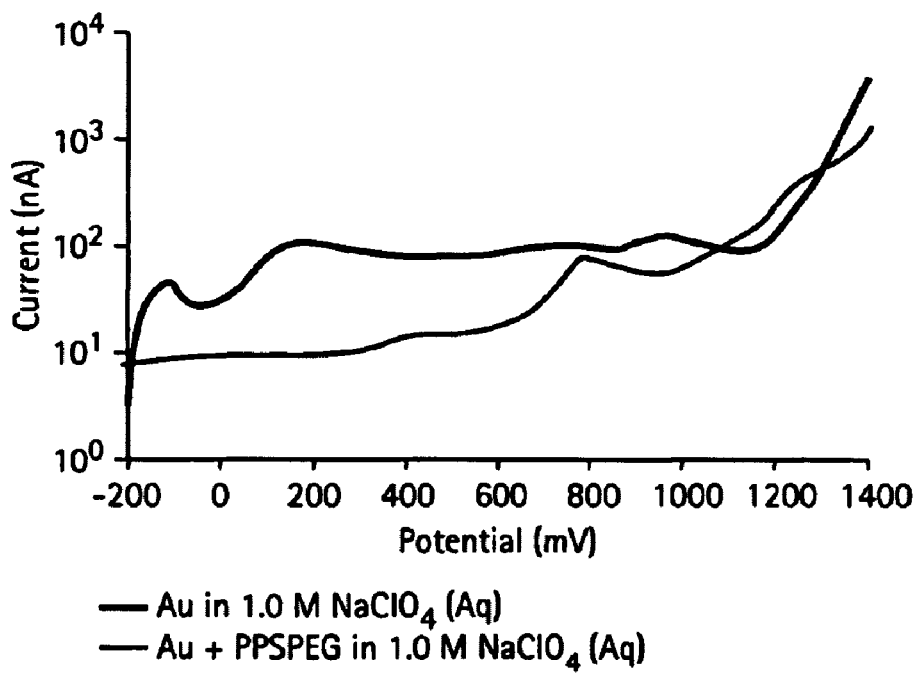

FIGS. 8A and 8B are schematic graphs of polarization curves for bare and thioether-coated surfaces immersed, respectively, in organic and aqueous solutions containing oxidizing species. Potential was ramped from –200 mV to 1400 mV while current was measured. The prominent bump in the polarization curves at approximately 800 mV for surfaces coated with PPS-PEG was consistent with the oxidation potential of the PPS polymer.

Figure 9:
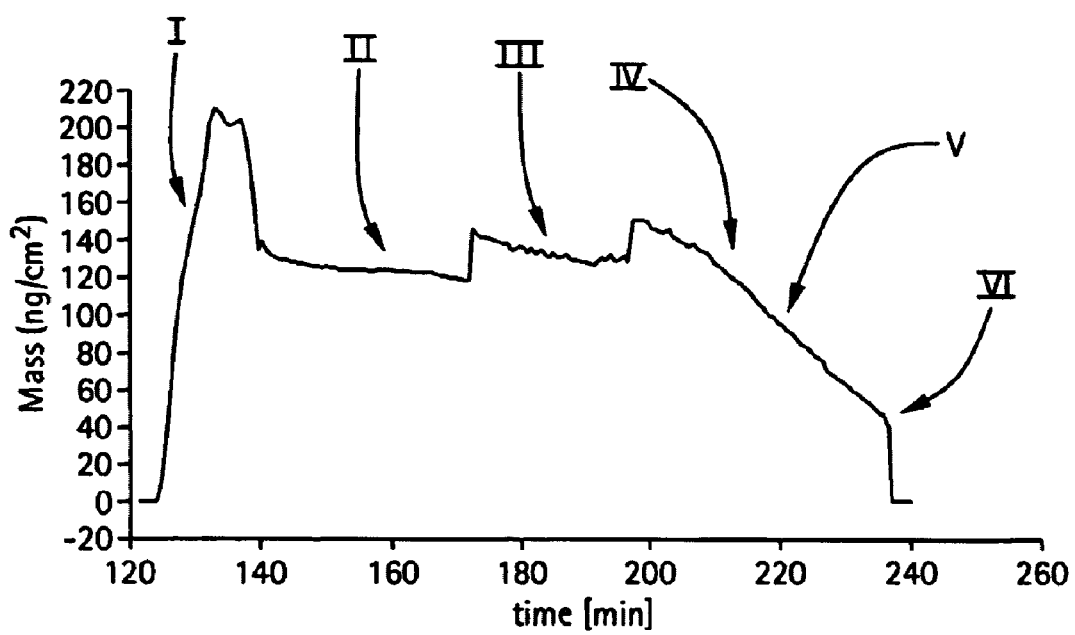
FIG. 9 is a graph of Electrochemical Optical Waveguide Light Spectroscopy ("EC OWLS") data, demonstrating adsorption of thioether polymer from an organic solution onto a conductive waveguide surface, an organic solution rinse, injection of oxidizing Redox species into the organic solution, application of a potential onto the coated waveguide, subsequent desorption of oxidized thioether therefrom, and removal of potential.

In FIG. 9, Electrochemical Optical Waveguide Light Spectroscopy ("EC OWLS") data demonstrates major steps in the method of the present invention. Point i illustrates adsorption of thioether polymer from an organic solution onto a conductive waveguide surface. At point ii, an organic solution rinse is applied. Next, oxidizing Redox species are injected into the organic solution, as seen at point iii. Potential is then applied to the coated waveguide at point iv, the thioether desorbs from the surface at point v, and, finally, potential is removed from the waveguide at point vi. Adsorbed mass returned to 0 ng/cm² after removal of potential, indicating complete desorption of the copolymer.

Figure 10A:
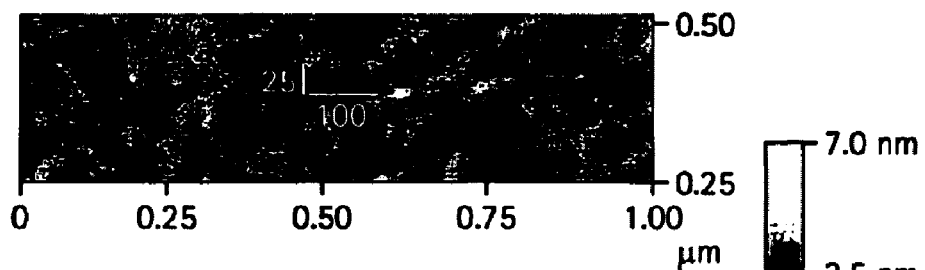
FIGS. 10A and 10B are deflection Atomic Force Microscope ("AFM") images of a target site locally affected in air at two different times.
Figure 10B:
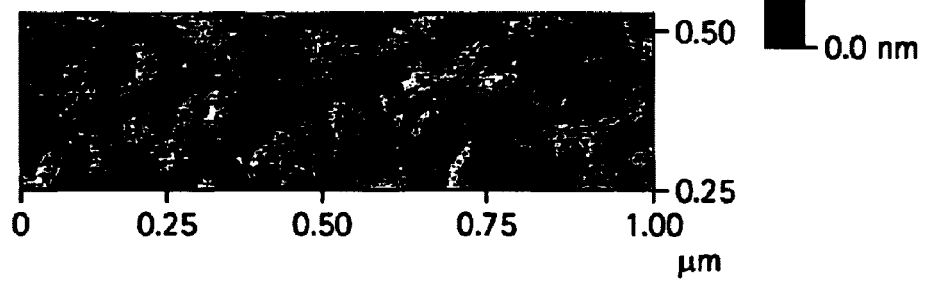

Referring now to FIG. 10, deflection Atomic Force Microscope ("AFM") images of a target site locally affected in air, using a scanning probe, at two different times are provided. A discernible change is visible in the target site between FIGS. 10A and 10B, providing still further verification of controllable oxidation.

OTHER EMBODIMENTS

From the foregoing description, it will be apparent that variations and modifications may be made to the invention described herein to adopt it to various usages and conditions. For example, alternative thioether B blocks capable of being oxidized may be substituted for PPS. Additionally, alkane thiolates, desirably hydrophobic, may be adsorbed to the surface and locally oxidized. Further still, it is expected that localized oxidation may be achieved with other forms of energy, such as radiation, e.g., ultraviolet radiation or electron-beam radiation, in addition to electricity.

All publications, patent applications, and patents mentioned in this specification are herein incorporated by reference to the same extent as if each individual publication, patent application, and patent was specifically and individually to be incorporated by reference.

Other embodiments are in the claims.

What is claimed is:

1. A method of patterning a surface, said method comprising the steps of:
    (a) providing a surface comprising an adsorbed thioether;
    (b) locally applying energy to said thioether to produce a locally oxidized region of said thioether; and
    (c) removing said locally oxidized region of said thioether to produce a patterned mask, thereby patterning said surface.

2. The method of claim 1, wherein step (b) occurs in a gaseous medium.

3. The method of claim 1, wherein step (b) occurs in a liquid medium or in a gel.

4. The method of claim 1, wherein in step (b), a patterned, conductive stamp is used to apply energy locally to said thioether.

5. The method of claim 1, wherein in step (b), a scanning probe is used to applying energy locally to said thioether.

6. The method of claim 1, wherein said surface is a conducting surface.

7. The method of claim 1, wherein said surface is a hydrophobic surface.

8. The method of claim 1, further comprising the step of performing an etching procedure on said surface through said patterned mask to produce a surface etched in the pattern of said locally oxidized region of step (b).

9. The method of claim 8 further comprising removing said mask from said surface after said etching.

10. The method of claim 8, wherein said thioether comprises a hydrophobic or amphiphilic block that has a glass transition temperature lower than the process temperature for etching.

11. The method of claim 8, wherein said thioether comprises a hydrophobic or amphiphilic block that has a glass transition temperature higher than the process temperature for etching.

12. The method of claim 1, further comprising the step of performing a deposition procedure on said surface through said patterned mask to produce a positive relief structure on said surface in the pattern of said locally oxidized region of step (b).

13. The method of claim 12, further comprising removing said mask from said surface after said deposition.

14. The method of claim 12, wherein said thioether comprises a hydrophobic or amphiphilic block that has a glass transition temperature lower than the process temperature for deposition.

15. The method of claim 12, wherein said thioether comprises a hydrophobic or amphiphilic block that has a glass transition temperature higher than the process temperature for deposition.

16. The method of claim 1, wherein said surface comprises a metal, a hydrophobic material, an electrically conducting material, a semiconducting material, silicon, or a combination thereof.

17. The method of claim 16, wherein said metal is gold, silver, or copper, or a combination thereof.

18. The method of claim 1, wherein said thioether is a block copolymer.

19. The method of claim 18, wherein said copolymer comprises a poly(propylene sulfide) block.

20. The method of claim 18, wherein said copolymer comprises a hydrophobic or amphiphilic polymer block.

21. The method of claim 20, wherein said hydrophobic or amphiphilic block comprises poly(ethylene glycol), poly(propylene oxide), or poly(1,2-butylene oxide).

* * * * *